United States Patent
Ho et al.

(10) Patent No.: US 7,768,748 B2
(45) Date of Patent: Aug. 3, 2010

(54) MAGNETORESISTIVE SENSOR WITH OVERLAID COMBINED LEADS AND SHIELDS

(75) Inventors: Kuok San Ho, Santa Clara, CA (US); Edward Hin Pong Lee, San Jose, CA (US); David John Seagle, Morgan Hill, CA (US); Ching Hwa Tsang, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 820 days.

(21) Appl. No.: 11/638,974

(22) Filed: Dec. 14, 2006

(65) Prior Publication Data

US 2008/0144229 A1   Jun. 19, 2008

(51) Int. Cl.
   *G11B 5/33* (2006.01)
(52) U.S. Cl. .................................................. 360/322
(58) Field of Classification Search ................. 360/319, 360/320, 322, 324.1, 324.11, 324.12
   See application file for complete search history.

(56) References Cited

U.S. PATENT DOCUMENTS

| | | | |
|---|---|---|---|
| 6,185,078 B1 | 2/2001 | Lin et al. ............... 360/324.12 |
| 6,591,481 B2* | 7/2003 | Shimazawa et al. ...... 29/603.18 |
| 6,614,629 B1* | 9/2003 | Kakihara ................ 360/324.1 |
| 6,707,294 B2* | 3/2004 | Takano ..................... 324/210 |
| 6,717,779 B2* | 4/2004 | Nagai ................... 360/324.12 |
| 6,735,058 B2 | 5/2004 | Lin et al. |
| 6,807,032 B1 | 10/2004 | Seigler et al. |
| 6,819,530 B2 | 11/2004 | Gill |
| 6,876,527 B2* | 4/2005 | Gill ....................... 360/324.12 |
| 6,882,507 B2 | 4/2005 | Shiraki et al. |
| 6,954,341 B2* | 10/2005 | Kamata et al. ............... 360/322 |
| 6,973,712 B2* | 12/2005 | Chen et al. ............... 29/603.14 |
| 7,019,948 B2* | 3/2006 | Shoji ........................... 360/322 |
| 7,075,761 B2* | 7/2006 | Parker ...................... 360/327.3 |
| 7,079,362 B2* | 7/2006 | Hasegawa ............... 360/324.12 |
| 7,107,667 B2* | 9/2006 | Ito et al. .................. 29/603.07 |
| 7,186,470 B2* | 3/2007 | Gill et al. ................. 428/811.5 |
| 7,194,796 B2* | 3/2007 | Lee et al. ................. 29/603.12 |
| 7,313,856 B2* | 1/2008 | Gill .......................... 29/603.14 |
| 7,440,239 B2* | 10/2008 | Kamiguchi et al. .... 360/324.11 |

(Continued)

OTHER PUBLICATIONS

Chinese Office Action Summary from application No. 2007101998509 mailed on Aug. 21, 2009.

(Continued)

*Primary Examiner*—Angel A. Castro
(74) *Attorney, Agent, or Firm*—Zilka-Kotab, PC

(57) ABSTRACT

An improved magnetic head for a hard disk drive including a lead overlaid read head in which the read width and read gap are reduced. The read width, which corresponds to the distance between the inner ends of the overlaid electrical leads, is reduced by the fabrication of a thin read width insulation member prior to the fabrication of the overlaid electrical leads. The read gap is reduced by fabricating the overlaid electrical leads from a magnetic, electrically conductive material such as NiFe, whereby the overlaid electrical leads also function as a magnetic shield. The read gap, which is the distance between the first and second magnetic shields is thus reduced as compared to the prior art by the thickness of the electrical leads and the thickness of the prior art second insulation layer formed between the electrical leads and the second magnetic shield.

10 Claims, 5 Drawing Sheets

U.S. PATENT DOCUMENTS

| | | | |
|---|---|---|---|
| 7,663,846 B2 * | 2/2010 | Freitag et al. | 360/324.11 |
| 2001/0028540 A1 | 10/2001 | Sakaguci et al. | 360/324.12 |
| 2002/0154453 A1 | 10/2002 | Ikeda | |
| 2003/0035249 A1 | 2/2003 | Ho et al. | |
| 2003/0156361 A1 | 8/2003 | Li et al. | 360/324.12 |
| 2003/0206379 A1 | 11/2003 | Lin et al. | |
| 2004/0042131 A1 | 3/2004 | Dobisz et al. | 360/324.12 |
| 2004/0047085 A1 | 3/2004 | Liao et al. | |
| 2004/0156148 A1 | 8/2004 | Chang et al. | |
| 2005/0052789 A1 | 3/2005 | Zhang et al. | |
| 2005/0152064 A1 | 7/2005 | Bedell et al. | |
| 2005/0174691 A1 | 8/2005 | Gill et al. | 360/135 |

OTHER PUBLICATIONS

European Search Report from European Application No. 07013734.4-1232 mailed on Sep. 30, 2008.

* cited by examiner

MAGNETORESISTIVE SENSOR WITH OVERLAID COMBINED LEADS AND SHIELDS

BACKGROUND OF THE INVENTION

1. Field of the Invention

The present invention relates generally to read head portions of magnetic heads for hard disk drives, and more particularly to lead overlaid read heads wherein the electrical leads and second magnetic shield are combined.

2. Description of the Prior Art

Increasing the performance of hard disk drives may be achieved by increasing the areal data storage density of the magnetic hard disk. This can be accomplished by reducing the written data track width, such that more tracks per inch can be written on the disk. To read data from a disk with a reduced track width, it is necessary to develop read heads with a sufficiently narrow read width, such that the narrow data tracks can be accurately read, and unwanted magnetic field interference from adjacent data tracks is substantially eliminated when reading a narrow data track.

The standard prior art read head elements include a plurality of thin film layers that are deposited and fabricated to produce a GMR read head, as is known to those skilled in the art. Significantly, where the width of the thin film layers that comprise the GMR read head sensor are reduced below certain values, the magnetic properties of the layers are substantially compromised. To overcome this problem, GMR read heads have been developed in which the thin film layers have an ample width and the electrical leads are overlaid on top of portions of the thin film layers. This lead overlaid configuration has the effect of creating an active read head sensor region having a read width that is less than the entire width of the deposited sensor layers, such that the magnetic properties of the thin film layers can be preserved. Thus, in the lead overlaid GMR read heads of the prior art, the active magnetic layer portions of the sensor exist between the inner ends of the electrical leads.

Increases in the areal data storage density of magnetic disks are also achieved by increasing the number of bits per inch on the data tracks of the disk, and this is accomplished by reducing the in-track size of the data bits. To read such reduced size data bits, it is necessary to reduce the read gap of the read sensor, where the read gap is defined as the distance between the magnetic shields that are fabricated beneath and above the sensor layers.

To improve the performance characteristics of such lead overlaid read heads, it is therefore desirable to decrease the read width between the inner ends of the overlaid leads and to decrease the read gap between the magnetic shields. The present invention addresses these issues.

SUMMARY OF THE INVENTION

The present invention is an improved magnetic head for a hard disk drive including a lead overlaid read head in which the read width and read gap are reduced. The read width, which corresponds to the distance between the inner ends of the overlaid electrical leads, is reduced by the fabrication of a thin read width insulation member prior to the fabrication of the overlaid electrical leads. The read gap is reduced by fabricating the overlaid electrical leads from a magnetic, electrically conductive material such as NiFe, whereby the overlaid electrical leads also function as a magnetic shield. The read gap, which is the distance between the first and second magnetic shields is thus reduced as compared to the prior art.

It is an advantage of the magnetic head of the present invention that it includes a read head having a reduced read width.

It is another advantage of the magnetic head of the present invention that it includes a read head having a reduced read gap.

It is a further advantage of the magnetic head of the present invention that it includes a read head having combined electrical leads and a magnetic shield.

It is yet another advantage of the magnetic head of the present invention that it includes a read head with reduced noise and side reading problems.

It is an advantage of the hard disk drive of the present invention that it includes a magnetic head of the present invention that includes a read head having a reduced read width.

It is another advantage of the hard disk drive of the present invention that it includes a magnetic head of the present invention that includes a read head having a reduced read gap.

It is a further advantage of the hard disk drive of the present invention that it includes a magnetic head of the present invention that includes a read head having combined electrical leads and a magnetic shield.

It is yet another advantage of the hard disk drive of the present invention that it includes a magnetic head of the present invention that includes a read head with reduced noise and side reading problems.

It is an advantage of the method for fabricating a magnetic head of the present invention that it includes a read head having combined electrical leads and a magnetic shield whereby fewer fabrication steps are required.

These and other features and advantages of the present invention will no doubt become apparent to those skilled in the art upon reading the following detailed description, which makes reference to the several figures of the drawings.

IN THE DRAWINGS

DETAILED DESCRIPTION OF THE PREFERRED EMBODIMENTS

Figure 1:
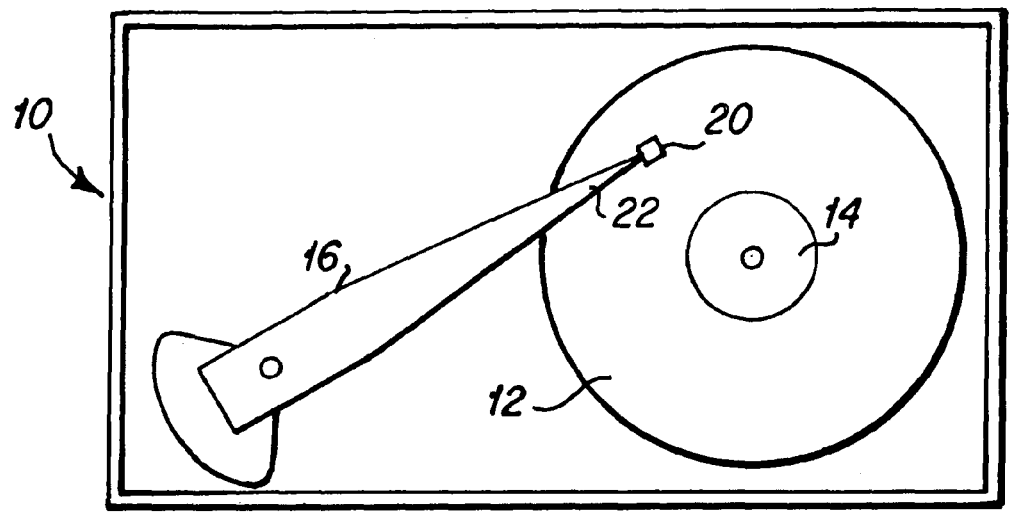
FIG. 1 is a top plan view depicting a hard disk drive having a magnetic head of the present invention.

FIG. 1 is a top plan view that depicts significant components of a hard disk drive which includes the magnetic head of the present invention. The hard disk drive 10 includes a magnetic media hard disk 12 that is rotatably mounted upon a motorized spindle 14. An actuator arm 16 is pivotally mounted within the hard disk drive 10 with a magnetic head 20 of the present invention disposed upon a distal end 22 of the actuator arm 16. A typical hard disk drive 10 may include a plurality of disks 12 that are rotatably mounted upon the spindle 14 and a plurality of actuator arms 16 having a magnetic head 20 mounted upon the distal end 22 of each of the actuator arms. As is well known to those skilled in the art, when the hard disk drive 10 is operated, the hard disk 12 rotates upon the spindle 14 and the magnetic head 20 acts as an air bearing slider that is adapted for flying above the surface of the rotating disk. The slider includes a substrate base upon which the various layers and structures that form the magnetic head are fabricated. Such heads are fabricated in large quantities upon a wafer substrate and subsequently sliced into discrete magnetic heads 20.

One way to increase the areal data storage density of a hard disk 12 is to narrow the track width of the data tracks written on the hard disk, such that more tracks per inch can be written on the disk. To write data in narrower tracks it is necessary to develop the write head components of magnetic heads with a narrower written track width. Correspondingly, it is also necessary to develop read head components of such magnetic heads 20 having narrowed active read widths, such that the narrow data tracks can be read and side reading from adjacent data tracks is minimized. However, as is known in the prior art performance limitations exist with regard to the width of the thin film layers that form the read head active components of GMR read heads. That is, the desirable magnetic properties of the thin film sensor layers of the read head are adversely affected where the width of the sensor layers is decreased below certain values. A prior art attempt to overcome this limitation is the lead overlaid read head configuration that is depicted in FIG. 2, and next described.

Figure 2:
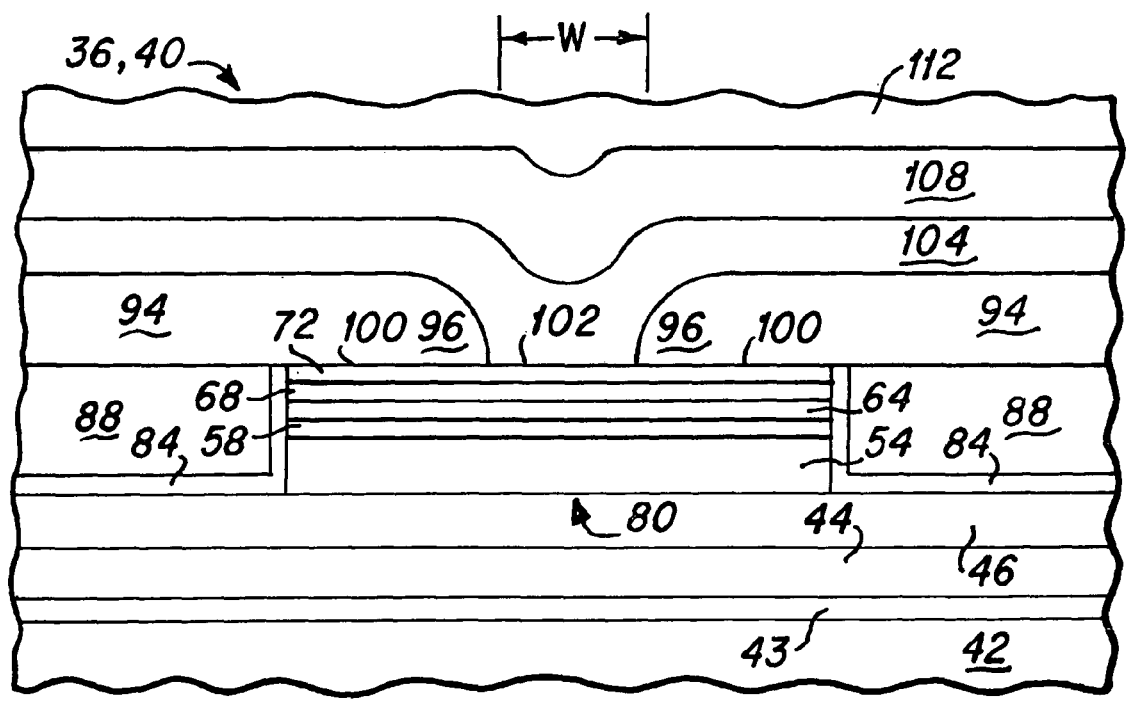
FIG. 2 is a side elevational view of a prior art lead overlaid read head portion of a magnetic head.

FIG. 2 is a side cross-sectional view of a prior art electrical lead overlaid GMR read head 36 portion of a magnetic head 40. As depicted therein, the prior art lead overlaid read head 36 generally includes a substrate base 42 that constitutes the wafer material upon which the magnetic head is fabricated, such as alumina titanium carbide. A first magnetic shield 44 is fabricated on an undercoat layer 43 that is deposited upon the substrate, and an insulation layer 46, typically composed of aluminum oxide, is fabricated upon the magnetic shield 44. A series of thin film sensor layers are sequentially deposited upon the insulation layer 46. A variety of thin film sensor layers are known in the prior art to fabricate such GMR read heads, and, for the purposes of the present invention the layers generally include an antiferromagnetic layer 54, a pinned magnetic layer 58 that is deposited upon the antiferromagnetic layer 54, a spacer layer 64 that is deposited upon the pinned magnetic layer 58, a free magnetic layer 68 that is deposited upon the spacer layer 64 and a cap layer 72 that is deposited upon the free magnetic layer 68. Typically, the antiferromagnetic layer 54 may be composed of PtMn, the pinned magnetic layer 58 may be composed of CoFe, the spacer layer 64 may be composed of Cu, the free magnetic layer 68 may be composed of CoFe and the cap layer 72 may be composed of Ta.

Following the deposition of the read head sensor layers 54-72, a patterned etching process is conducted such that only central regions 80 of the sensor layers 54-72 remain. Thereafter, a thin layer 84 of electrical insulation is deposited in the side regions along side the central sensor region 80, and hard bias elements 88 are deposited on the insulation layer 84 on each side of the central sensor region 80. Following the deposition of the hard bias elements 88, electrical lead elements 94 are fabricated on top of the hard bias elements 88. As depicted in FIG. 2, inner ends 96 of the leads 94 are overlaid on top of outer portions 100 of the layers 54-72 of the central read head sensor region 80. A central portion 102 of the sensor layers 80 is not covered by the inner ends 96 of the leads 94. A second insulation layer 104 is fabricated on top of the electrical leads 94 and cap layer 72, followed by the fabrication of a second magnetic shield 108, and further components 112 (not shown in detail) that are well known to those skilled in the art are thereafter fabricated, to ultimately create a complete magnetic head.

A significant feature of the prior art lead overlaid GMR read head 36 depicted in FIG. 2 is that the portion of the central sensor region 80, which substantially defines the read width W of the read head 36, is the central portion 102 of the central sensor region 80 that is disposed between the inner ends 96 of the electrical leads 94. That is, because the electrical current flows through the read head sensor layers between the electrical leads 94, the active portion of the sensor layers generally comprises the read width W between the inner ends 96 of the electrical leads 94. The outer portions 100 of the read head layers disposed beneath the overlaid inner ends 96 of the electrical leads 94 are generally passive in that significant electrical current between the electrical leads 94 does not pass through them.

The read gap of the prior art magnetic head is defined as the distance between the first and second magnetic shields 44 and 108 respectively. As can be seen in FIG. 2, this read gap includes the thickness of the first insulation gap layer, the sensor layers and the second insulation gap layer. Where the inner ends of the overlaid electrical leads are placed close together, as is desired to produce a narrow read width, the thickness of the second gap layer must generally approximate the thickness of the electrical leads to avoid electrical shorts to the second magnetic shield.

To respond to higher data density disks it is necessary to reduce the read width of the magnetic head without increasing signal noise and side-reading effects from adjacent data tracks. Also, it is desirable to reduce the read gap such that higher density data tracks can be accurately read without increased signal noise from in-track data bits on the data track that are disposed adjacent to the data bit being read.

Figure 3:
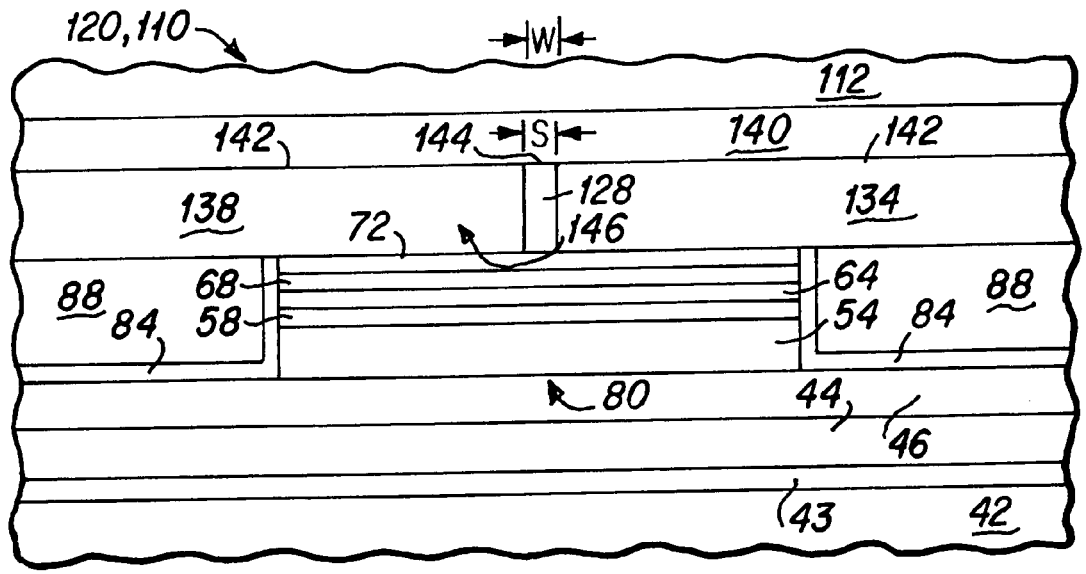
FIG. 3 is a side elevational view of a first embodiment of a lead overlaid read head portion of a magnetic head of the present invention.

A first magnetic head embodiment of the present invention 110, which is suitable for use as the magnetic head 20 of the disk drive 10 of FIG. 1, having a lead overlaid read head 120 of the present invention is depicted in FIG. 3. For ease of comprehension, similar structures of the present invention and prior art are identically numbered. As depicted in FIG. 3, the read head 120 includes a GMR read head thin film sensor element 80, as well as the insulation layer 84 and the hard bias elements 88. A significant feature of the read head 120 is the fabrication of a separate, centrally located read width electrical insulation member 128 that is disposed between two overlaid electrical leads 134 and 138, where the insulation member 128 is centrally disposed upon the thin film sensor element 80. A second significant feature of the read head 120 is that the leads 134 and 138 are fabricated from a magnetic shield material such as NiFe, and preferably though not necessarily Permalloy (80/20 NiFe). An electrical insulation layer 140 is fabricated upon the upper surfaces 142 of the electrical leads 134, 138 and the upper surface 144 of the electrical insulator 128.

As with the prior art lead overlaid read head sensor depicted in FIG. 2 and described hereabove, electrical current 146 will flow through an electrical lead 134, through the sensor layers 80 due to the electrical insulation member 128 and through the other electrical lead 138. As a result, the effective read width W of the read head 120 is generally approximately equal to the width S of the electrical insulator member 128, plus some characteristic additional width on each side of the electrical insulation member 128 depending on the relative electrical resistivities of the sensor layers and the leads. Therefore, controlled fabrication of the width S of the insulation member 128, and particularly a reduction in the width S, results in the reduction in the read width W of the read head 120, resulting in a magnetic head 110 that is suitable for reading narrow track widths of a higher density data disk.

Another significant feature of the read head 120 is that the electrical leads 134, 138 also serve as the second magnetic shield, in that they are comprised of a magnetic shield material such as NiFe. Significantly, there is no insulation layer, corresponding to the second insulation layer 104 of the prior art magnetic head depicted in FIG. 2, between the second magnetic shield 134, 138 and the sensor layers 58-72 of the read head 120. As a result, the read gap distance between the first magnetic shield 44 and the second magnetic shield (the electrical leads 134, 138) is reduced as compared to the prior art because the second insulation layer 104 (see FIG. 2) is not required to be fabricated between the two magnetic shields 44 and 134, 138. The reduction of the read gap increases the in-track reading sensitivity of the read head 120. In this regard, the read head 120 is also suitable for higher density magnetic disks having an increased bits per inch data track density. A method for fabricating the read head 120 of the present invention is next described with the aid of FIGS. 4-8.

Figure 4:
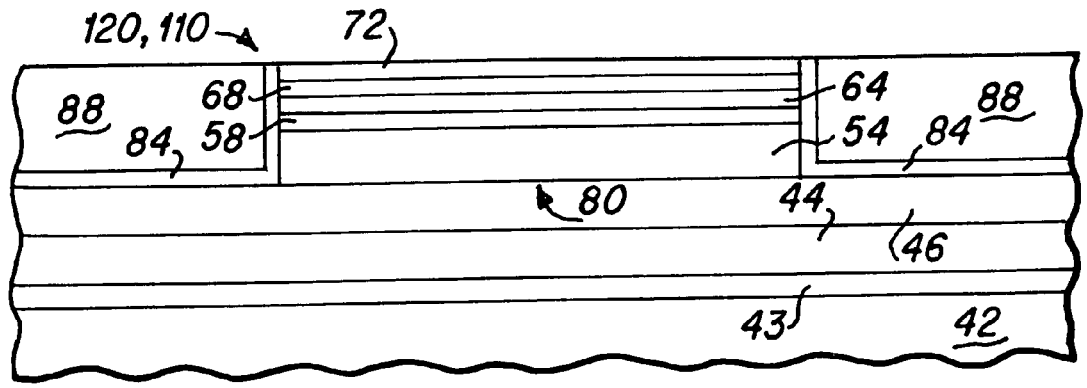
FIGS. 4-8 are side elevational views of fabrication steps for lead overlaid read head portion of a magnetic head of the present invention.

FIG. 4 represents a starting point for a description of the fabrication method of the present invention. As depicted therein, the undercoat layer 43, the first magnetic shield 44 and the first insulation layer 46 have been fabricated upon a magnetic head substrate 42. Thereafter, the various layers that comprise the GMR sensor layers 54-72 have been deposited and patterned to create the central sensor layer structure 80. Thereafter, a thin layer 84 of electrical insulation material, such as alumina, is deposited along side the central sensor 80, and hard bias elements 88 are fabricated upon the insulation layer 84. The thin insulation layer 84 is preferably, though not necessarily, fabricated using an atomic layer deposition (ALD) method as is known to those skilled in the art. It is therefore to be understood that this stage of read head fabrication is substantially identical to that depicted in FIG. 2, and well understood by those skilled in the art.

Figure 5:
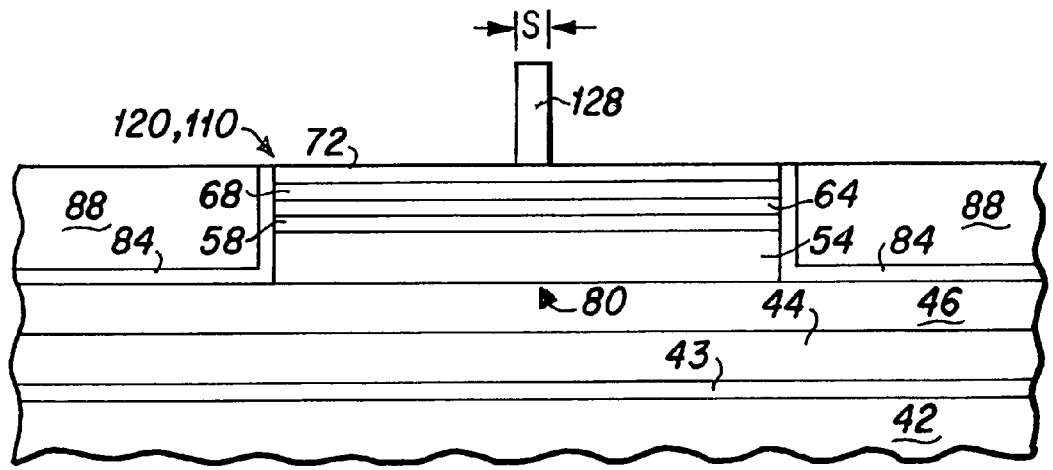

Thereafter, as depicted in FIG. 5, the read width electrical insulation member 128 is fabricated upon the central sensor 80. It is desirable that the insulation member 128 be fabricated centrally between the hard bias elements 88, and that the height (referred to as stripe height (not shown)) of the insulation member 128 extend at least as far as the stripe height of the sensor element 80, as will be understood by those skilled in the art. It is also desirable that the width S of the insulator member 128 be controllably narrow, because the read width W of the magnetic head is significantly, though not entirely, determined by the width S of the insulator member 128.

Various fabrication methods, as are known to those skilled in the art, may be utilized to fabricate the thin insulation member 128. For example, one such insulation member fabrication method includes the fabrication of a vertical photoresist wall at the desired location of the insulation member 128. Thereafter, utilizing a deposition process such as ALD, a layer of insulation member material is deposited upon the horizontal surfaces and on the vertical photoresist wall. Then, using a reactive ion etch (RIE) process, the insulation layer material is removed; however, due to the very directional nature of the RIE process, the insulation material is removed from the horizontal surfaces, whereas the insulation material deposited on the vertical wall of the photoresist remains. Thereafter, upon removal of the photoresist, a thin, vertical, insulation member 128 remains having a width S that is approximately equal to the thickness of the ALD deposited layer. Using this fabrication method a high aspect ratio electrical insulation member 128 comprised of a material such as alumina is fabricated, and the width S can be controlled to dimensions as low as 1-40 nm, where 1 nm is approximately the minimum desired width due to unwanted electrical tunneling of electrons through a thin film alumina layer of approximately 1 nm or less, as is well known to those skilled in the art.

Figure 6:
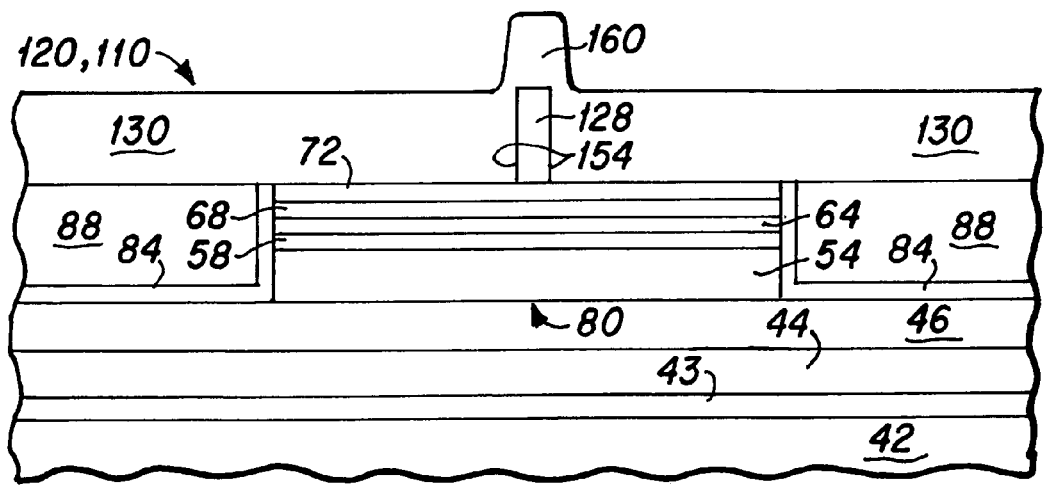

Thereafter, as depicted in FIG. 6, the electrical lead material 130 is deposited in an appropriate pattern upon the device, such that the electrical lead material 130 is disposed at side surfaces 154 of the insulation member 128. As indicated hereabove, the electrical leads are comprised of a magnetic material such as NiFe, and they may be sputter deposited or electroplated in a suitable electrical lead pattern. As depicted in FIG. 6, where the electrical lead material is sputter deposited, a quantity 160 of electrical lead material will be deposited upon the electrical insulation member 128.

Figure 7:
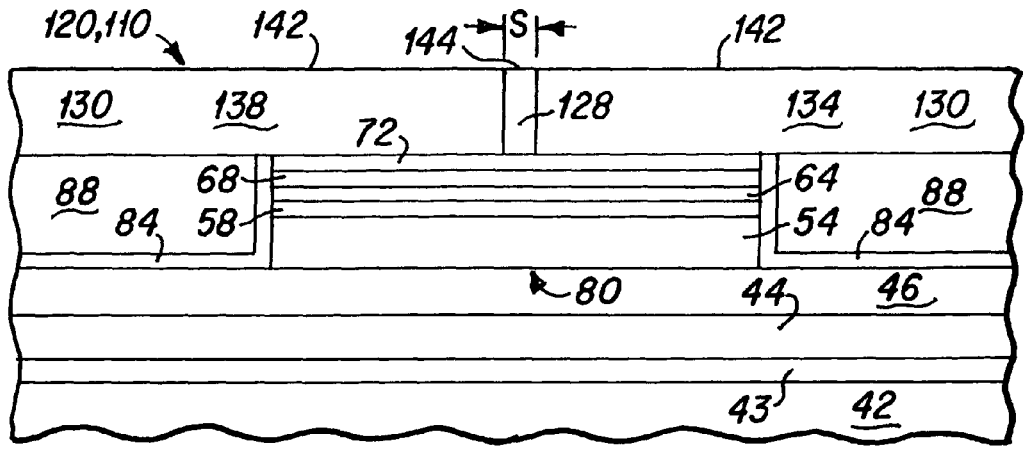

Thereafter, as depicted FIG. 7, following the deposition of the electrical lead material 130, a chemical mechanical polishing (CMP) step is undertaken to remove the extra electrical lead material 160 and to create the top surfaces 142 of the leads and expose the top surface 144 of the electrical insulation member 128. It is important that the top surface 144 of the electrical insulation member 128 be exposed, such that any possible electrical shorts between the electrical leads 134, 138 are prevented by the insulation member 128, and sensor current between the leads is thereby caused to pass through the central sensor 80.

Figure 8:
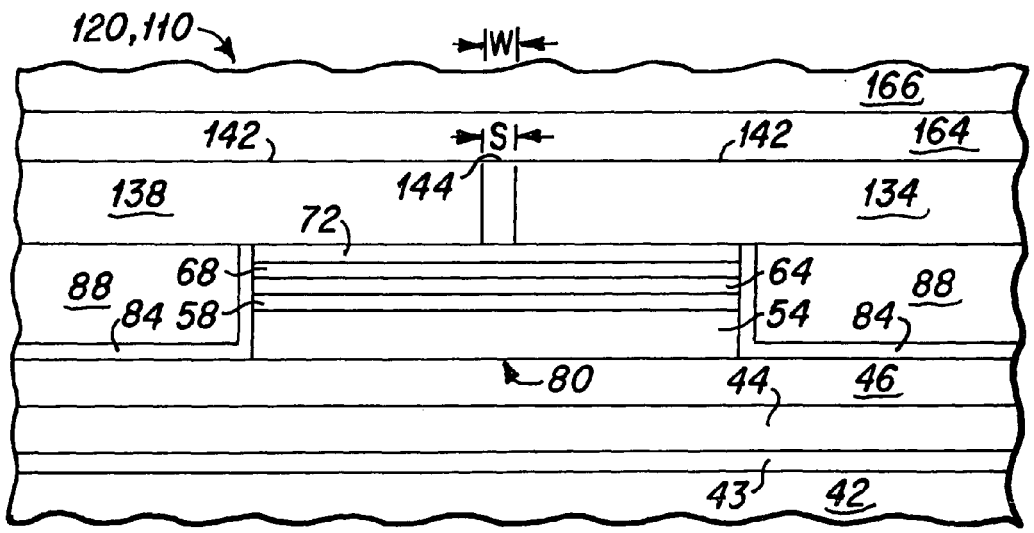

As depicted in FIG. 8, after the leads 134, 138 are fabricated, electrical insulation material 164, such as alumina, is next deposited across the top surfaces 142 of the electrical leads and the top surface 144 of the electrical insulation member 128, such that the electrical leads 134 and 138 are covered by insulation material 164 to prevent electrical shorts. The electrical leads 134, 138, being comprised of a magnetic material, also function as the second magnetic shield of the read head 120, and serve to prevent unwanted side reading and noise from adjacent data tracks. Further magnetic head components 166 (not shown in detail), such as write head components, are then fabricated upon the insulation layer 164 in a plurality of well known subsequent steps to ultimately create a complete magnetic head 110.

Figure 9:
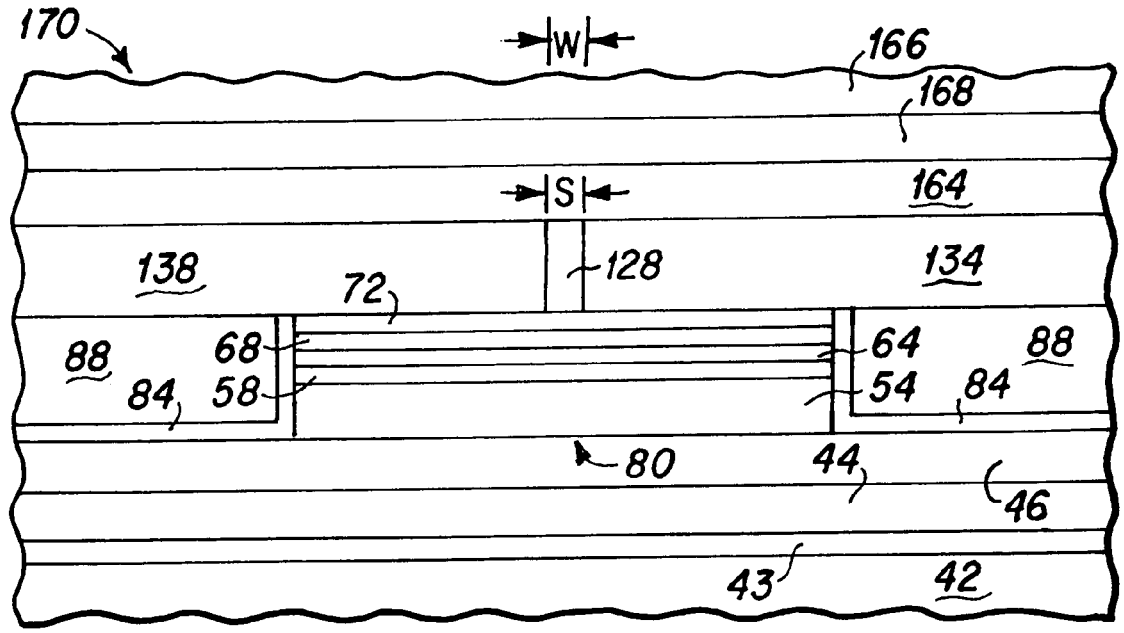
FIG. 9 is a side elevational view of an alternative embodiment of a lead overlaid read head portion of a magnetic head of the present invention.

Alternatively, as depicted in FIG. 9, an alternative read head embodiment 170 can be created by deposition of a second layer of magnetic material 168, such as NiFe, above the insulation material layer 164 to provide a more robust magnetic shielding for the read head sensor. However, the primary magnetic shielding, which essentially controls the read gap distance, is provided by the electrical leads 134, 138 (second magnetic shield) that are comprised of magnetic material.

Figure 10:
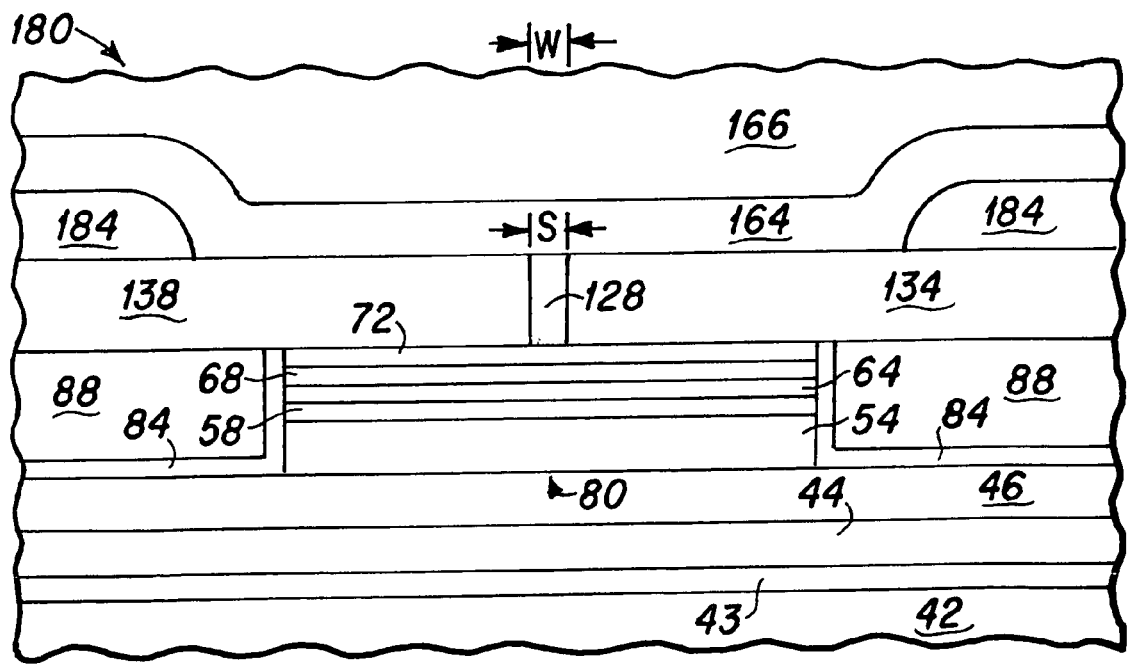
FIG. 10 is a side elevational view of another embodiment of a lead overlaid read head portion of a magnetic head of the present invention.

FIG. 10 depicts an alternative read head embodiment 180 of the present invention having many similar structures to the read head 120 depicted in FIGS. 3 and 8, and such similar structural elements are identically numbered for ease of comprehension. As depicted in FIG. 10, the significant difference in the magnetic head 180 is that outer portions 184 of the electrical leads are formed from a non-magnetic, better electrical conductor than NiFe, such as Rh. The outer portions 184 of the electrical leads are fabricated upon the NiFe magnetic electrical leads 134, 138 following the CMP step depicted in FIG. 7. Such outer electrical leads 184, being composed of a non-magnetic electrical conductor, are desirable to reduce unwanted signal noise that can be created if the entire electrical lead structure of the read head is comprised of a magnetic material. As with the preceding read head embodiment 120, the read head 180 produces reduced noise and reduced side reading.

It is therefore to be understood that the read width W of the magnetic head of the present invention can be effectively reduced to approximately the width S of the insulation member 128, plus some characteristic additional width on each side of the insulation member 128 depending on the relative electrical resistivities of the sensor layers and the leads, utilizing the electrical lead overlaid fabrication method of the present invention. Unwanted magnetic noise and side reading can be likewise reduced by fabricating the overlaid leads from a magnetic material such as NiFe. This places the magnetic shield closer to the sensor layers 80, and also reduces the read gap of the read head.

Significant features of the present invention are the reduced read width and reduced read gap of the read head, which result in reduced signal noise. Higher density data disks may be effectively read with the read head sensor of the magnetic head of the present invention. The present invention is intended to apply to various types and configurations of GMR read heads that include various numbers and types of thin film layers to provide improved read head characteristics for lead overlaid configurations. Therefore, while the present invention has been shown and described with regard to certain preferred embodiments, it will be understood that those skilled in the art will no doubt develop certain alterations and modifications thereto which nevertheless include the true spirit and scope of the invention. It is therefore intended that the following claims cover all such alterations and modifications.

What we claim is:

1. A magnetic head, comprising:
   a first magnetic shield;
   a first insulation layer being disposed above said first magnetic shield;
   a plurality of sensor layers being disposed above said first insulation layer;
   a read width insulation member being disposed above said sensor layers:
   two electrical leads being disposed above said sensor layers said electrical leads are comprised of a magnetic material, thereby servicing as a second magnetic shield , wherein one said electrical lead is disposed on a first side of said read width insulation member and in a same deposition plane therewith and a second said electrical lead is disposed on another side of said read width insulation member and in a same deposition plane therewith;
   a second insulation layer being disposed above said electrical leads and above said read width insulation member.

2. A magnetic head as described in claim 1 wherein said read width insulation member is formed with a width of from approximately 1 nm to approximately 40 nm.

3. A magnetic head as described in claim 1 wherein said magnetic material is NiFe.

4. A magnetic head as described in claim 1, wherein said electrical lead includes an inner portion that is comprised of a magnetic material and an outer portion that is comprised of a non-magnetic material.

5. A magnetic head as described in claim 1 including a further magnetic shield that is disposed upon said second insulation layer.

6. A hard disk drive including a magnetic head, comprising:
   a first magnetic shield;
   a first insulation layer being disposed above said first magnetic shield;
   a plurality of sensor layers being disposed above said first insulation layer;
   a read width insulation member being disposed above said sensor layers;
   two electrical leads being disposed above said sensor layers said electrical leads are comprised of a magnetic material, thereby servicing as a second magnetic shield , wherein one said electrical lead is disposed on a first side of said read width insulation member and in a same deposition plane therewith and a second said electrical lead is disposed on another side of said read width insulation member and in a same deposition plane therewith;
   a second insulation layer being disposed above said electrical leads and above said read width insulation member.

7. A hard disk drive as described in claim 6 wherein said read width insulation member is formed with a width of from approximately 1 nm to approximately 40 nm.

8. A hard disk drive as described in claim 6 wherein said magnetic material is NiFe.

9. A hard disk drive as described in claim 6, wherein said electrical lead includes an inner portion that is comprised of a magnetic material and an outer portion that is comprised of a non-magnetic material.

10. A hard disk drive as described in claim 6 including a further magnetic shield that is disposed upon said second insulation layer.

* * * * *